(12) United States Patent
Kim et al.

(10) Patent No.: US 6,908,800 B1
(45) Date of Patent: *Jun. 21, 2005

(54) TUNABLE SIDEWALL SPACER PROCESS FOR CMOS INTEGRATED CIRCUITS

(75) Inventors: Youngmin Kim, Allen, TX (US); Shawn T. Walsh, Richardson, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154 (a)(2).

Subject to any disclaimer, the term of this patent is extended or adjusted under 35 U.S.C. 154(b) by 0 days.

(21) Appl. No.: 09/574,653

(22) Filed: May 18, 2000

Related U.S. Application Data

(60) Provisional application No. 60/137,774, filed on Jun. 4, 1999.

(51) Int. Cl.[7] .......................................... H01L 21/8238
(52) U.S. Cl. ...................... 438/199; 438/216; 438/230; 438/232
(58) Field of Search ................................ 438/199, 216, 438/217, 227, 229, 230–232; 257/351, 369, 257/350

(56) References Cited

U.S. PATENT DOCUMENTS

| | | | | |
|---|---|---|---|---|
| 5,254,866 A | * | 10/1993 | Ogoh | 257/369 |
| 5,963,803 A | * | 10/1999 | Dawson et al. | 438/231 |
| 5,994,743 A | * | 11/1999 | Masuoka | 257/369 |
| 6,020,231 A | * | 2/2000 | Wang et al. | 438/228 |

* cited by examiner

*Primary Examiner*—Hsien Ming Lee
(74) *Attorney, Agent, or Firm*—Peter K. McLarty; W. James Brady, III; Frederick J. Telecky, Jr.

(57) ABSTRACT

A mixed voltage CMOS process for high reliability and high performance core transistors and input-output transistors with reduced mask steps. A gate stack (30) is formed over the silicon substrate (10). Ion implantation is performed of a first species and a second species to produce the doping profiles (70, 80, 90, 100) in the input-output transistors.

7 Claims, 1 Drawing Sheet

TUNABLE SIDEWALL SPACER PROCESS FOR CMOS INTEGRATED CIRCUITS

This application claims the benefit of provisional application Ser. No. 60/137,774 filed Jun. 4, 1999.

FIELD OF THE INVENTION

The invention is generally related to the field of MOSFET transistors and more specifically to a novel method of forming tunable sidewalls in CMOS integrated circuits for optimized performance of both the NMOS and PMOS transistors.

BACKGROUND OF THE INVENTION

As the critical dimensions on CMOS integrated circuits scale down, series resistance is becoming an increasingly important limitation for transistor performance. Series resistance mainly arises from the following three sources in the transistor: the lightly doped drain (LDD) structure, the contact and line resistance, and the channel resistance. The LDD structure which is necessary to reduce hot electron degradation is the largest contributor to the total series resistance in the transistor. The effect of series resistance on transistor drive current (Ion) is a function of the current itself and the higher conductivity of NMOS transistors make them more susceptible to series resistance effects than PMOS transistors.

Currently, the LDD structure is formed using sidewall spacers and self aligned ion implantation. Typically, after the gate structure is formed, a self aligned implant is performed to form the LDD structures in regions adjacent to the transistor gate. N-type dopant species are implanted in NMOS transistors and p-type dopant species are implanted in PMOS transistors. Following this LDD implant, a thick layer of silicon nitride is formed and anisotropically etched to form sidewall structures adjacent to the gate of both the NMOS and PMOS transistors. Source and drain implants are then performed to form the heavily doped source and drain regions for both transistor types. During the annealing of the implanted species, diffusion will cause the LDD region to shift under the gate regions. This diffusion will be larger for the PMOS transistors due to the use of boron in the LDD and source and drain regions.

A reduction in the series resistance of the transistor can be achieved by reducing the sidewall thickness thereby shortening the LDD regions. This shortening will however result in the overrun of the LDD regions in the PMOS transistors caused by diffusion from the source drain regions. This will lead to increased transistor leakage currents rendering the circuit inoperable. There is a therefore a need for a method of tuning the sidewall spacers for both the NMOS and PMOS transistors without adding cost and complexity to the process.

SUMMARY OF THE INVENTION

The instant invention is a method of forming sidewall structures in CMOS integrated circuits for optimized performance of both the NMOS and PMOS transistors. The method comprises the steps of: forming a PMOS transistor gate structure on a n-type region of a semiconductor substrate; forming a NMOS transistor gate structure on a p-type region of said semiconductor substrate; forming sidewall structures adjacent to said NMOS transistor gate structure and said PMOS transistor gate structure; and etching said sidewall structure adjacent to said NMOS transistor gate structure such that the width of the sidewall structure adjacent to said NMOS transistor gate structure is less than the width of the sidewall structure adjacent to said PMOS transistor gate structure. The etching of the sidewall is performed using an anisotropic etch and the sidewall structure is a material selected from the group consisting of silicon nitride, silicon oxide, and silicon oxynitride.

DETAILED DESCRIPTION OF THE INVENTION

Figure 1A:
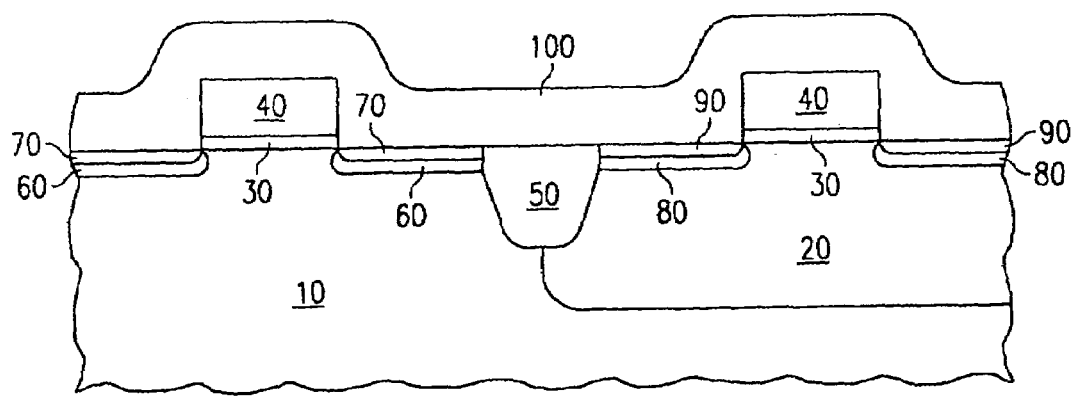
FIGS. 1A–1C are cross-sectional diagrams for an embodiment of the instant invention.
Common reference numerals are used throughout the figures to represent like or similar features. The figures are not drawn to scale and are merely provided for illustrative purposes.
Figure 1B:
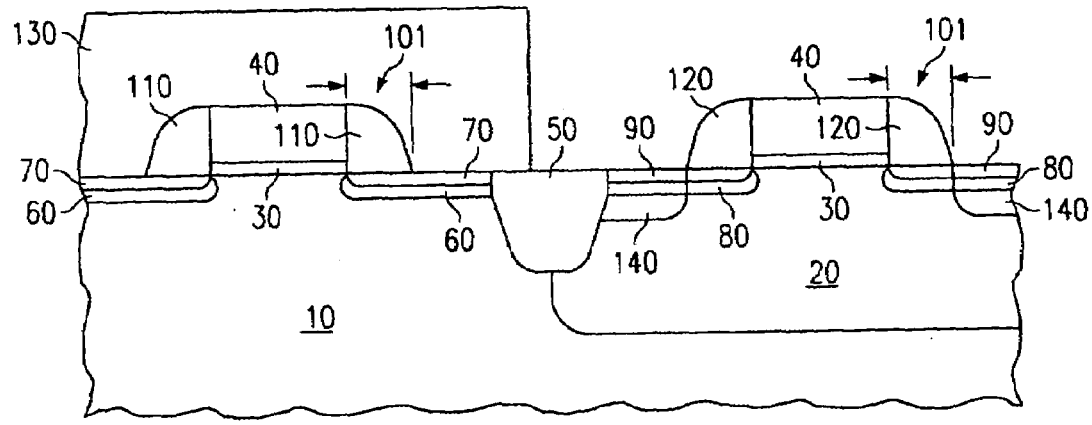
Figure 1C:
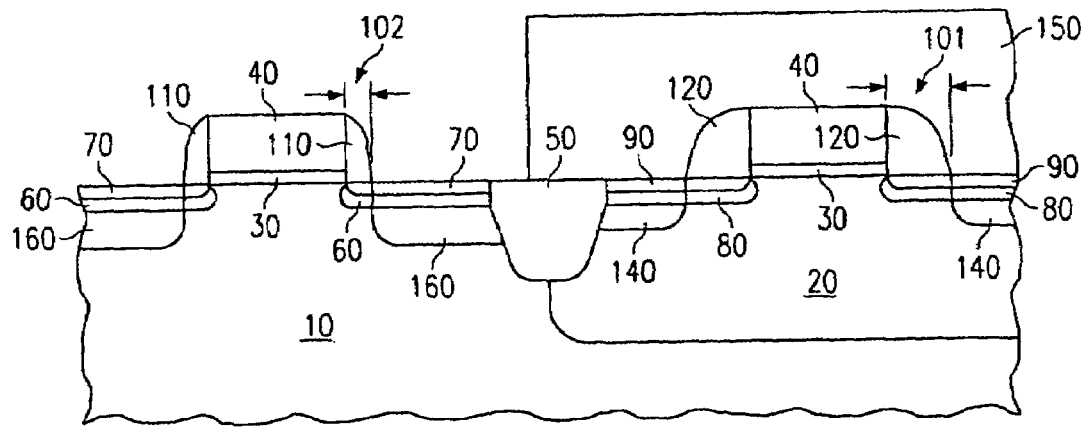

While the following description of the instant invention revolves around FIGS. 1A–1C, the instant invention can be utilized in any semiconductor device structure. The methodology of the instant invention provides a solution to tuning the width of the sidewall spacers for both NMOS and PMOS transistors with no added process complexity.

Referring to FIG. 1A, a substrate 10 of a first conductivity type is provided containing a region of a second conductivity type 20. In an embodiment of the instant invention, the first conductivity type is p-type and the second conductivity type is n-type. A gate dielectric 30 is formed on both regions of the substrate 10 and 20. The gate dielectric 30 may be comprised of an oxide, thermally grown $SiO_2$, a nitride, an oxynitride, or any combination thereof, and is preferably on the order of 1 to 10 nm thick. A layer of silicon containing material (which will be patterned and etched to form gate structure 40) is formed on gate dielectric 30. Preferably, this silicon-containing material is comprised of polycrystalline silicon ("poly" or "polysilicon"), but it may be comprised of epitaxial silicon or any other semiconducting material. Contained in the substrate will be isolation structures 50. These isolation structures may comprise an oxide or some other insulator. The purpose of the isolation structure 50 is to isolate the actives devices from one another on the substrate.

For the embodiment of the instant invention shown in FIGS. 1A–1C, the substrate 10 is p-type and the well 20 is n-type. The NMOS transistor will be fabricated in 10 and the PMOS transistor in region 20. With the gate structures 40 defined, a layer of photoresist is formed over the substrate 10. Using standard photolithographic techniques, the resist is patterned and etched to produce areas of resist that cover the PMOS transistor. A blanket pocket p-type implant followed by a blanket n-type LDD implant is performed resulting in the p-type doping profile 60, and the n-type doping profile 70. In current integrated circuit technology, pocket implants refer to an implant that is used to reduce the effect of the short transistor gate length on transistor properties such as threshold voltage. The effect of the pocket implant is not however limited to threshold voltage. The pocket implant for a particular transistor type usually results in a doping profile that extends beyond the drain extension of the transistor. The species of the p-type pocket implant can consist of B, $BF_2$, Ga, In, or any other suitable p-type dopant. The species of the n-type LDD implant can consist of As, P, Sb, or any other suitable n-type dopant. The order of the implants is somewhat arbitrary and the LDD implant could be performed before the pocket implant. After the completion of the p-type pocket implant, the n-type LDD implant, and any subsequent processing if required, the photoresist is removed using standard processing techniques. Following the removal of the photoresist any number of processes may be performed before forming the LDD regions of the PMOS transistors.

To form the PMOS LDD regions, a layer of photoresist is formed on the substrate 10, patterned and etched to cover or mask the NMOS transistor. A blanket pocket n-type implant followed by a blanket p-type LDD implant is performed resulting in the n-type doping profile 80, and the p-type doping profile 90. The species of the n-type pocket implant can consist of As, P, Sb or any other suitable n-type dopant. The species of the p-type LDD implant can consist of B, BF2, Ga, In, or any other suitable p-type dopant. The order of the implants is somewhat arbitrary and the LDD implant could be performed before the pocket implant. After completion of the implants and any other necessary process steps a sidewall film 100 is formed on the substrate. The photoresist is removed and a sidewall film 100 is formed over the gate structures 40 and the surface of the substrate 10 for the purposes of forming sidewall structures for the gate structures 40. This sidewall film can comprise of silicon nitride, silicon oxynitride, silicon oxide, or any film with similar properties.

Shown in FIG. 1B is the structure of FIG. 1A after an anisotropic sidewall etch process. The sidewall structures for the NMOS transistor 110 and the PMOS transistor 120 are formed simultaneously using the same etching process. These initial sidewall structures have a first width 101 as shown in FIG. 1B. In an embodiment where the sidewall film is silicon nitride, a two step etch process can be used to form the sidewalls. The first step consists of a timed silicon nitride plasma etch with a base pressure of 100–300 mT, a power level of 100–300 Watts, a gap of 1.5 cm, 120–200 sccm of SF6, 50–80 sccm of He, and 6 Torr He backside pressure. This etch process has a silicon nitride, silicon, silicon oxide selectivity of about 1 to 1. This process is used to etch the majority of the sidewall film. The second step of the sidewall etch process is a highly selective nitride etch process. This process comprises a base pressure of 400–800 mT, a power level of 100–300 Watts, a gap of 1.0 cm, 120–200 sccm of SF6, 5–30 sccm of HBr, and 6 Torr He backside pressure. This etch process has a silicon nitride, silicon, silicon oxide selectivity of about 4 to 1. Following the sidewall formation and any other necessary process steps the source drain regions are formed. Typically, this process involves two masking steps using photoresist as the masking material. In the first masking step, photoresist is formed and patterned 130 to cover the NMOS transistor and the source drain region for the PMOS transistor formed by ion implantation. This results in the p-type doping profile 140 shown in FIG. 1B. The species of the p-type source drain implant can consist of B, BF2, Ga, In, or any other suitable p-type dopant.

In the second masking step, the photoresist film 130 is removed and a new photoresist film is formed and patterned 150 to cover or mask the PMOS transistor as shown in FIG. 1C. An addition sidewall etch is performed with the resist film 150 present to reduce the width of the NMOS sidewalls 110 while leaving the PMON sidewalls 120 unaffected. The new width of the NMOS transistor 102 will be less than the sidewall width 101 of the PMOS transistor. This etch should be relatively isotropic and have high selectivity to the exposed silicon and silicon oxide surfaces on the wafer. For the embodiment where the sidewall is silicon nitride, a suitable etch process is a plasma etch comprising a base pressure of 400–800 mT, a power level of 100–300 Watts, a gap of 1.0 cm, 120–200 sccm of SF6, 5–30 sccm of HBr, and 6 Torr He backside pressure. This etch process has a silicon nitride, silicon, silicon oxide selectivity of about 4 to 1. Following this selective NMOS sidewall etch, the source drain regions of the NMOS transistor are formed using ion implantation. The resulting n-type doping profile 160 is shown in FIG. 1C. The species of the n-type source drain implant can consist of As, P, Sb or any other suitable n-type dopant. The CMOS integrated circuit can then be completed using the necessary processing steps. By reducing the width of the sidewall structures 102 of the NMOS transistor compared to the sidewall structures of the PMOS transistors 101, the series resistance associated with the NMOS LDD can be reduced with out affecting the transistor leakage current of the PMOS transistor.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of forming a CMOS sidewall spacer, comprising the steps of:
    forming a PMOS transistor gate structure on a n-type region of a semiconductor substrate;
    forming a NMOS transistor gate structure on a p-type region of said semiconductor substrate;
    forming initial single layer sidewall structures of a first width adjacent to said NMOS transistor gate structure and said PMOS transistor gate structure; and
    etching said initial single layer sidewall structure adjacent to said NMOS transistor gate structure such that a width of a first single layer sidewall structure adjacent to said NMOS transistor gate structure is less than a width of a second single layer sidewall structure adjacent to said PMOS transistor gate structure.

2. The method of claim 1 wherein said etching of said initial single layer sidewall structure is an isotropic etch.

3. The method of claim 1 wherein said initial single layer sidewall structure is a material selected from the group consisting of silicon nitride, silicon oxide, and silicon oxynitride.

4. A method of forming a CMOS sidewall spacer method comprising the steps of:
    providing a semiconductor substrate of a first conductivity type with a region of a second conductivity type;
    forming a gate dielectric on said semiconductor substrate;
    forming a conductive layer on said gate dielectric;
    etching said conductive layer and said gate dielectric to form a first transistor gate stack with an upper surface on said semiconductor substrate of a first conductivity and a second transistor gate stack with an upper surface on said region of said semiconductor substrate of a second conductivity type;
    forming LDD regions adjacent the first transistor gate stack and adjacent the second transistor gate stack;
    forming a sidewall film over said semiconductor substrate;
    etching said sidewall film using an anisoptropic etch such that all of said sidewall film is removed from said upper surface of said first transistor gate stack and said upper surface of said second transistor gate stack, wherein a plurality of sidewall structures of a first width are formed adjacent to said first transistor gate stack and said second transistor gate stack;

masking said second transistor gate stack with a photoresist pattern used for source drain implantation; and etching said sidewalls of a first width adjacent to said first transistor gate stack thereby forming sidewalls of a second width adjacent to said first transistor gate stack wherein said second width is less than said first width.

5. The method of claim 4 wherein said sidewall film is silicon nitride, silicon oxide, or silicon oxynitride.

6. The method of claim 4 wherein said anisotropic etch is a plasma etch.

7. The method of claim 4 wherein said first conductivity type is p-type.

* * * * *